United States Patent [19]
Griffin et al.

[11] Patent Number: 4,570,084
[45] Date of Patent: Feb. 11, 1986

[54] CLOCKED DIFFERENTIAL CASCODE VOLTAGE SWITCH LOGIC SYSTEMS

[75] Inventors: William R. Griffin; Lawrence G. Heller, both of South Burlington, Vt.

[73] Assignee: International Business Machines Corporation, Armonk, N.Y.

[21] Appl. No.: 554,146

[22] Filed: Nov. 21, 1983

[51] Int. Cl.[4] .............. H03K 19/017; H03K 19/096; H03K 19/20; H03K 19/21

[52] U.S. Cl. .................... 307/452; 307/453; 307/471

[58] Field of Search ............. 307/448, 451, 452, 453, 307/471, 472, 496, 497, 268, 279, 530

[56] References Cited

U.S. PATENT DOCUMENTS

| | | | |
|---|---|---|---|
| 3,651,342 | 3/1972 | Dingwall | 307/451 X |
| 3,911,289 | 10/1975 | Takemoto | 307/451 |
| 3,917,958 | 11/1975 | Hatsukano | 307/453 X |
| 4,350,905 | 9/1982 | Sato | 307/451 |
| 4,367,420 | 1/1983 | Foss et al. | 307/453 |
| 4,401,903 | 8/1983 | Iizuka | 307/451 |

FOREIGN PATENT DOCUMENTS 0095726  6/1982  Japan .................. 307/451

OTHER PUBLICATIONS

Lane, "Bipolar FET High-Speed Logic Switch"; IBM-TDB; vol. 14, No. 12, pp. 3684-3685; 5/1972.

Murphy et al, 1981 IEEE International Solid-State Circuits Conf., "A CMOS 32b Single ..", Feb. 2, 1981, pp. 230, 231 and 276.

Krambeck et al, IEEE J. of Solid-State Circuits, "High-Speed Compact Circuits with CMOS", June 1982, vol. SC-17, No. 3, pp. 614-619.

*Primary Examiner*—Larry N. Anagnos
*Attorney, Agent, or Firm*—Stephen J. Limanek

[57] ABSTRACT

A differential logic system is provided for a complete logic family which has a first switching circuit that produces a given output signal at a first output node and a second switching circuit that produces a second output signal which is the complement of that of the given output signal at a second output node. First and second clocked devices are connected from the first and second output nodes, respectively, to a voltage source, and first and second inverters are connected to the first and second output nodes, respectively. Additionally, a regenerative circuit may be connected between the first and second output nodes and the voltage source.

22 Claims, 3 Drawing Figures

CLOCKED DIFFERENTIAL CASCODE VOLTAGE SWITCH LOGIC SYSTEMS

TECHNICAL FIELD

This invention relates to logic systems and more particularly to differential logic systems of the cascode voltage switch (CVS) type.

BACKGROUND ART

Logic systems of the single ended cascode voltage switch type are described in commonly assigned U.S. patent application having Ser. No. 554,148 filed by W. R. Griffin and L. G. Heller on even date. These circuits are generally made in the complementary metal oxide semiconductor (CMOS) technology having an N channel transistor, or NMOS, matrix as a logic system with a P channel transistor, or PMOS, matrix as a complementary logic network.

Another of the cascode voltage switch type logic circuits, but of a differential type, is disclosed in commonly assigned U.S. patent application Ser. No. 508,454, filed by J. W. Davis and N. G. Thoma on June 27, 1983. This differential logic circuit includes cross-coupled P channel load devices coupled to complementary outputs of an NMOS logic network.

In an article in 1981 IEEE International Solid-State Circuits Conference, Feb. 20, 1981, pp. 230, 231 and 276 by B. T. Murphy et al entitled "A CMOS 32b Single Chip Microprocessor" and also in an article in IEEE Journal of Solid-State Circuits, Vol. SC-17, No. 3, June 1982, by R. H. Krambeck et al entitled "High-Speed Compact Circuits with CMOS" there is disclosed single-ended clocked dynamic CMOS logic circuits which include a P channel device as a load connected to an NMOS logic network with an inverter connected between an output terminal and the P channel load device.

It should be noted that the above referenced Murphy et al and Krambeck et al logic circuits cannot be used to provide a complete logic family.

DISCLOSURE OF THE INVENTION

It is an object of this invention to provide a logic circuit which produces a complete logic family with differential outputs and which is free of output skew and glitching.

In accordance with the teachings of this invention, a differential logic system is provided which has a first switching circuit that produces a given output signal at a first output node and a second switching circuit that produces a second output signal which is the complement of that of the given output signal at a second output node. First and second clocked devices are connected from the first and second output nodes, respectively, to a voltage source, and first and second inverters are connected to the first and second output nodes, respectively. Additionally, a regenerative circuit may be connected between the first and second output nodes and the voltage source.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
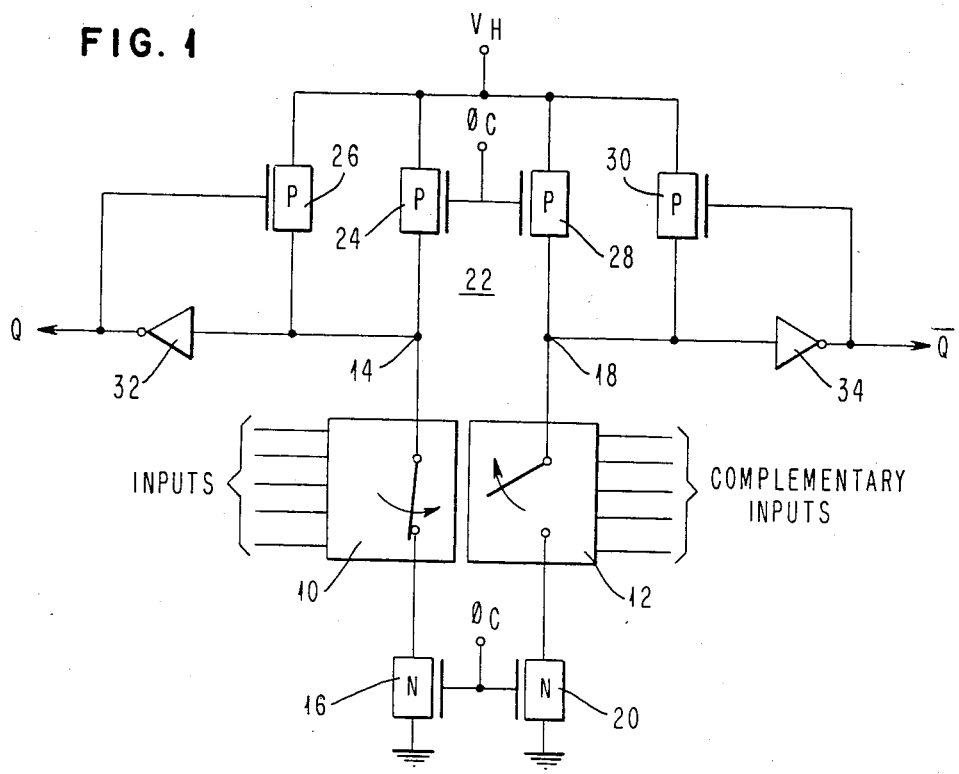
FIG. 1 illustrates one embodiment of the present invention as a clocked differential CVS logic system made in CMOS technology.

Referring to the drawings in more detail, there is illustrated in FIG. 1 one embodiment of the present invention which is a clocked differential cascode voltage switch logic circuit or system that includes first and second logic networks 10 and 12 each acting as a switch such that when one of the switches is closed, such as 10, the other switch 12 is open, and vice versa. Given input signals, identified as inputs, and input signals complementary to the given input signals, identified as complementary inputs, are applied to first and second logic systems 10 and 12, respectively, for controlling the operation of the switches in systems 10 and 12. Network 10 is connected between an output node 14 and one electrode of a first enabling or pull down N channel transistor 16 and network 12 is connected between an output node 18 and one electrode of a second enabling N channel transistor 20. A clock pulse $\phi_C$ is applied to the control gates of transistors 16 and 20 with the other electrodes of these transistors being connected to ground.

A load circuit 22 includes first and second P channel transistors 24 and 26 connected between output node 14 and a source of potential $V_H$ which may have a voltage of +5 volts. The load circuit 22 also includes third and fourth P channel transistors 28 and 30 connected between output node 18 and source $V_H$. The clock pulse $\phi_C$ is also applied to the control gates of transistors 24 and 28. An inverter 32 is connected between output node 14 and an output terminal Q, with the output terminal Q being connected to the control gate of transistor 26. An inverter 34 is connected between output node 18 and an output terminal $\overline{Q}$, with the output terminal $\overline{Q}$ being connected to the control gate of transistor 30.

In the operation of the system of FIG. 1, the output nodes 14 and 18 are precharged to +5 volts by applying a low voltage with clock pulse $\phi_C$ to the control gates of the transistors 24 and 28 which turn on the transistors 24 and 28. During precharge time both output terminals Q and $\overline{Q}$ are at a low voltage and, therefore, all inputs to the logic networks 10 and 12 from other similar systems are also low at this time. To evaluate the information applied to inputs and complementary inputs of logic networks 10 and 12, respectively, the clock pulse $\phi_C$ applies a high voltage to enabling transistors 16 and 20 which turns on transistors 16 and 20, transistors 24 and 28 being turned off. In view of the dual nature of the first and second networks 10 and 12, one of these networks will act as a closed switch, e.g., network 10, which effectively grounds output node 14, while network 12 acts as an open switch which prevents output node 18 from discharging.

Since the voltage at output node 18 is high at approximately +5 volts, the voltage at the output terminal $\overline{Q}$ is low due to the presence of the inverter 34. With the voltage at the output terminal $\overline{Q}$ low, the P channel transistor 30 is turned on to maintain the voltage at output node 18 at +5 volts. Similarly, it can be seen that with the voltage on the output node 14 low, the voltage on the output terminal Q is high which maintains the P channel transistor 26 in an off condition. As can be seen, if desired, a single N channel transistor may be used instead of the two transistors 16 and 20.

It can be readily seen that with the complementary input signals, inputs and complementary inputs, applied to the first and second networks 10 and 12, respectively, and with inverters 32 and 34 connected to differential output terminals Q and $\overline{Q}$ any logic function can be performed in the system of FIG. 1, i.e., the system of FIG. 1 is capable of providing a complete clocked logic family.

Figure 2:
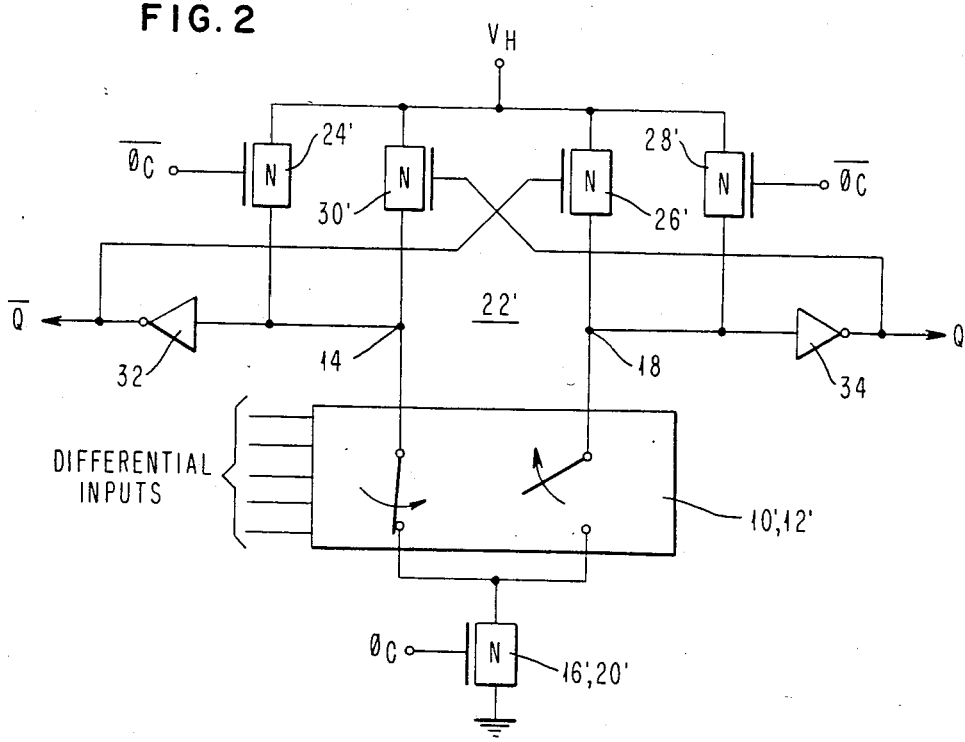
FIG. 2 illustrates another embodiment of the present invention as a clocked differential CVS logic system made in NMOS technology.

The embodiment of the invention illustrated in FIG. 2 of the drawings is similar to that of FIG. 1 with the principal difference being the use of N channel transistors for the load, indicated by 22', in place of the P channel transistors 24, 26, 28 and 30.

The clocked N channel transistors of the load 22' include transistors 24' and 28' having a clock pulse $\phi_C$ applied to the control gates thereof. The feedback transistors of load 22' include N channel transistors 30' and 26' with the output terminal Q being connected to the control gate of the transistor 30' and the output terminal $\overline{Q}$ being connected to the control gate of the transistor 26'. The logic network of the circuit of FIG. 2 of the drawings may be represented by a single network 10',12' which functions in much the same manner as the dual networks 10 and 12 of the logic system of FIG. 1, i.e., with differential inputs applied to the logic network 10',12' and enabling N channel transistor 16',20' turned on by clock pulse $\phi_C$. Only one of the nodes 14 and 18 is connected to ground during any given instant of time.

In the operation of the logic system of FIG. 2 of the drawings, the output nodes 14 and 18 are precharged to approximately +5 volts by applying a high voltage with clock pulse $\phi_C$ to the control gates of the transistor 24' and 28' which turns on the transistors 24' and 28'. To now evaluate the information applied to the differential inputs of the logic network 10',12', the clock pulse $\phi_C$ goes to a low value turning off the transistors 24' and 28' and the voltage of clock pulse $\phi_C$ rises to turn on the enabling transistor 16',20'. In view of the dual nature of the switching arrangement in the logic network 10',12', one of the switching paths in network 10',12' closes to discharge, e.g., node 14, through the enabling transistor 16',20' to ground, while the other switching path remains open, preventing node 18 from discharging.

Since the voltage at the output node 18 is high, the voltage at the output terminal Q is low due to the presence of the inverter 34. With the voltage at the output terminal Q low, the feedback transistor 30' is off, preventing charge from flowing to the node 14. Similarly, it can be seen that with the voltage on the output node 14 low, the voltage on the output terminal $\overline{Q}$ is high which maintains the transistor 26' on, charging node 18 to approximately +5 volts. It should be noted that the NMOS logic system of FIG. 2 requires two clock pulses, $\phi_C$ and $\overline{\phi}_C$, whereas the CMOS logic system of FIG. 1 requires only one clock pulse, $\phi_C$.

Figure 3:
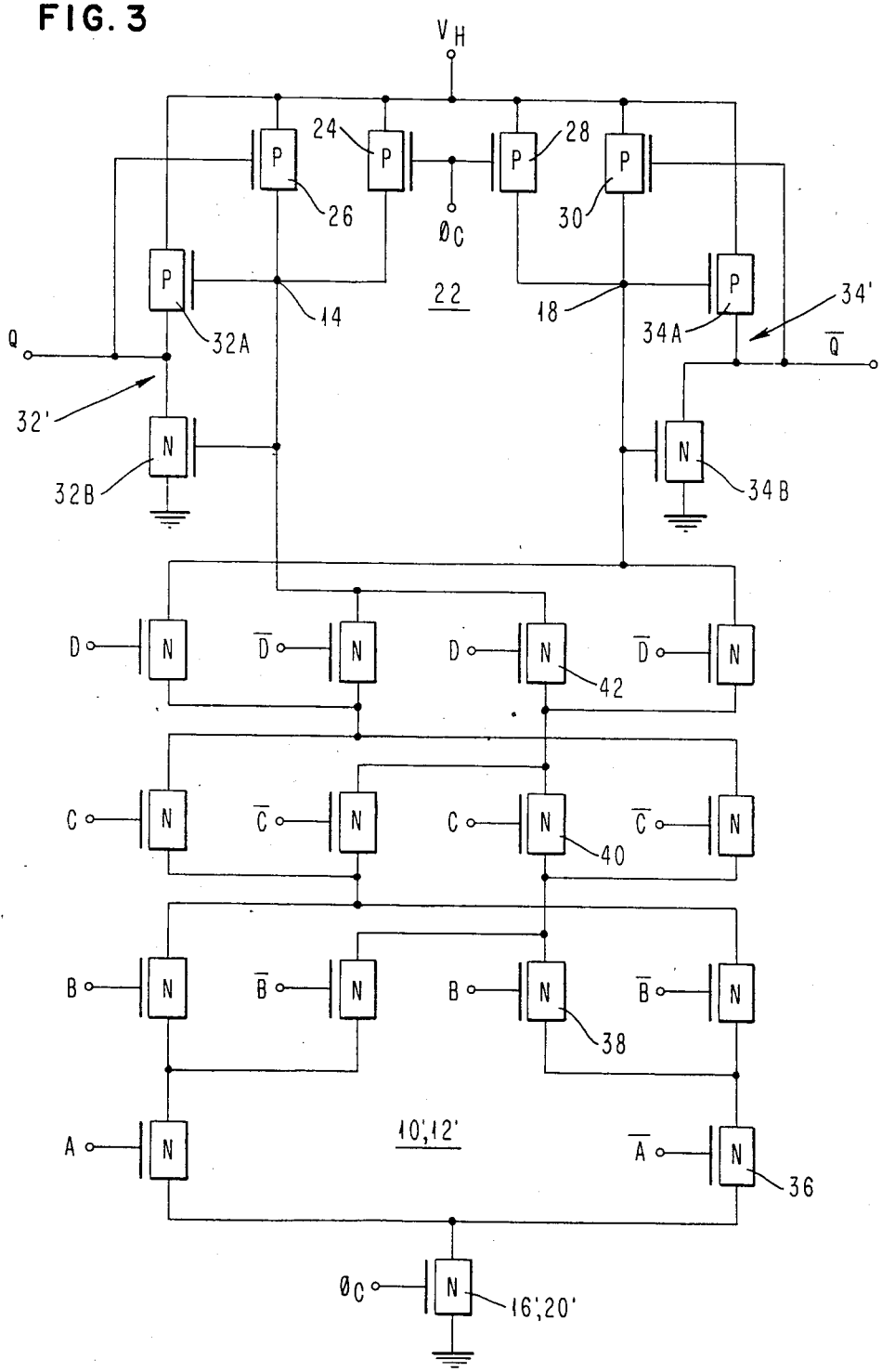
FIG. 3 shows an exclusive OR circuit in the system of the present invention made in CMOS technology.

FIG. 3 of the drawings illustrates the logic system of the present invention of the CMOS type shown in FIG. 1 with an exclusive OR logic network 10',12' made of N channel transistors N and the PMOS load with a first inverter 32' including a P channel transistor 32A and an N channel transistor 32B and a second inverter 34' including a P channel transistor 34A and an N channel transistor 34B. This exclusive OR circuit may be expressed by the Boolean function $$Q = \overline{A}\overline{B}CD + \overline{A}B\overline{C}D + \overline{A}BC\overline{D} + ABC\overline{D} + A\overline{B}\overline{C}D + \overline{A}\overline{B}C\overline{D} + \overline{A}BCD + A\overline{B}CD.$$

By referring to the Boolean function Q, it can be seen that, e.g., if the first product or term $\overline{A}\overline{B}CD$ has each literal represented by a binary 1, i.e., a high voltage, transistors 36, 38, 40 and 42 in the exclusive OR network 10',12' turn on to provide a discharge path from node 14 to ground through the enabling N channel transistor 16',20'. Thus, the outut terminal Q will be high or representative of a 1 binary digit of information. It should be noted that under these conditions there is no conductive path to ground from node 18, thus, node 18 remains high turning on inverter transistor 34B while inverter transistor 34A is off and output terminal $\overline{Q}$ is at a low voltage.

Likewise, it can be seen that any of the other terms or products of the Boolean function Q will produce a 1 binary digit, or high voltage, at output terminal Q when each of their literals is represented by a 1 binary digit or a high voltage, with output terminal $\overline{Q}$ being low.

Although a differential 4-way exclusive OR circuit is shown as the logic network 10',12' in FIG. 3 of the drawings, it should be understood that any logic circuit, such as a NAND or NOR circuit, of a complete family of logic circuits may be used in logic network 10',12' with differential outputs provided at output terminals Q and $\overline{Q}$. It should also be understood that the CVS logic system of the present invention provides a complete clocked logic family which is glitch-free with high performance. Additionally, the system of the present invention does not develop an output skew problem since output nodes 14 and 18 are never pulled up during an evaluation, only during the precharge period.

To more completely describe the invention, CMOS systems as well as an all NMOS system have been illustrated, however, it should be noted that for most applications the CMOS system is preferred since it does not require two clock pulse sources, as does the NMOS system.

While the invention has been particularly shown and described with reference to preferred embodiments thereof, it will be understood by those skilled in the art that various changes in form and details may be made therein without departing from the spirit aand scope of the invention.

What is claimed is:

1. A differential logic system comprising
   a first switching circuit including input terminals and a first output terminal having a given signal,
   a second switching circuit including input terminals and a second output terminal having a signal complementary to that of said first output terminal,
   a voltage source,
   a first clocked device connected between said voltage source and said first output terminal,
   a second clocked device connected between said voltage source and said second output terminal,
   a first inverter circuit having an input terminal connected to said first output terminal and an output terminal for providing an output signal, a second inverter circuit having an input terminal connected to said second output terminal and an output terminal for providing an output signal complementary to that at the output terminal of said first inverter, and means for applying given logic signals to the input terminals of said first switching circuit and for simultaneously applying complementary logic signals to the input terminals of said second switching circuit.

2. A differential logic system as set forth in claim 1 wherein said clocked devices are P channel devices and further including means for applying clocked pulses simultaneously to the control gates of said first and second P channel devices.

3. A differential logic system as set forth in claim 1 wherein said clocked devices are N channel devices and further including means for applying clocked pulses simultaneously to the control gates of said first and second N channel devices.

4. A differential logic system as set for in claim 1 wherein said first and second switching circuits include N channel devices having an enabling device and further including means for applying clocked pulses simultaneously to the control gates of said first and second clocked devices and said enabling device.

5. A differential logic system as set forth in claim 1 wherein said logic signals applying means includes a differential ended logic network.

6. A differential logic system as set forth in claim 1 further including regenerative circuits connected between said first and second output terminals and said voltage source.

7. A differential logic system as set forth in claim 1 further including clocked enabling means connected between each of said first and second switching circuits and a point of reference potential and means for simultaneously applying clocked pulses to said first and second clocked devices and to said clocked enabling means.

8. A differential logic system as set forth in claim 7 wherein each of said first and second clocked devices includes a P channel transistor and said clocked enabling means includes an N channel transistor.

9. A differential logic system as set forth in claim 8 further including a first P channel feedback transistor connected in parallel with said first clocked device having a control gate connected to the output terminal of said first inverter and a second P channel feedback transistor connected in parallel with said second clocked device having a control gate connected to the output terminal of said second inverter.

10. A differential logic system as set forth in claim 7 wherein each of said first and second clocked devices and said clocked enabling means includes an N channel transistor.

11. A differential logic system as set forth in claim 10 further including a first N channel feedback transistor connected in parallel with said first clocked device having a control gate connected to the output terminal of said second inverter and a second N channel feedback transistor connected in parallel with said second clocked device having a control gate connected to the output terminal of said first inverter.

12. A differential logic system as set forth in claim 7 further including first and second feedback circuits connected between said first and second output terminals, respectively, and said voltage source.

13. A differential logic system as set forth in claim 12 wherein said first inverter circuit includes a first P channel transistor and a first N channel transistor serially interconnected between said voltage source and a point of reference potential with the control gates of each of said transistors being connected to said first output terminal, and said second inverter circuit includes a second P channel transistor and a second N channel transistor serially interconnected between said voltage source and said point of reference potential with the control gates of each of said second P and N transistors being connected to said second output terminal.

14. A differential logic system as set forth in claim 1 wherein each of said first and second switching circuits includes an N channel transistor.

15. A differential logic system comprising a first switching circuit including input terminals and a first output node having a given signal, a second switching circuit including input terminals and a second output node having a signal complementary to that of said first output node, a first P channel device connected between said first output node and a source of potential, a second P channel device connected between said second output node and said source of potential, a first inverter circuit having an input connected to said first output node and an output terminal, a second inverter circuit having an input connected to said second output node and an output terminal, means for applying clock pulses to said first and second P channel devices, and means for applying differential logic signals simultaneously to the input terminals of said first and second switching circuits.

16. A differential logic system as set forth in claim 15 further including a first P channel feedback transistor connected in parallel with said first P channel device having a control gate connected to the output terminal of said first inverter and a second P channel feedback transistor connected in parallel with said second P channel device having a control gate connected to the output terminal of said second inverter.

17. A differential logic system comprising a logic network having inputs for receiving differential input signals and first and second output nodes for providing complementary output signals, a voltage source, a first clocked device connected between said first output node and said voltage source, a second clocked device connected between said second output node and said voltage source, clocked enabling means connected between a point of reference potential and said first and second output nodes through said logic network, means for applying clock pulses to said first and second clocked devices and said clocked enabling means, a first inverter circuit having an input connected to said first output node and an output terminal, and a second inverter circuit having an input connected to said second output node and an output terminal.

18. A differential logic system as set forth in claim 17 further including a first feedback transistor connected in parallel with said first clocked device and having a control gate connected to the output terminal of said first inverter and a second feedback transistor connected in parallel with said second clocked device and having a control gate connected to the output terminal of said second inverter.

19. A differential logic circuit comprising
an exclusive OR logic network having input terminals for receiving differential logic input signals and first and second output nodes for providing complementary output signals,
clocked means for enabling said network,
a voltage source,
a first clocked device connected between said first output node and said voltage source,
a second clocked device connected between said second output node and said voltage source,
means for applying clock pulses to said clocked means and said first and second clocked devices,
a first inverter having an input terminal connected to said first output node and an output terminal, and
a second inverter having an input terminal connected to said second output node and an output terminal.

20. A differential logic system as set forth in claim 19 wherein said exclusive OR network and said clocked means include N channel transistors and said first and second clocked devices include P channel transistors.

21. A differential logic system as set forth in claim 19 further including a first feedback transistor connected in parallel with said first clocked device and controlled by the output terminal of said first inverter and a second feedback transistor connected in parallel with said second clocked device and controlled by the output terminal of said second inverter.

22. A differential logic system comprising
a first switching circuit arranged in the form of an exclusive OR circuit including N channel transistors, input terminals and a first output terminal having a given signal,
a second switching circuit arranged in the form of an exclusive OR circuit including N channel transistors, input terminals and a second output terminal having a signal complementary to that of said first output terminal,
a voltage source,
a first clocked device connected between said voltage source and said first output terminal,
a second clocked device connected between said voltage source and said second output terminal,
a first inverter circuit having an output terminal and an input terminal connected to said first output terminal,
a second inverter circuit having an output terminal and an input terminal connected to said second output terminal, and
means for applying logic signals simultaneously to the input terminals of said first and second switching circuits.

* * * * *